(12) United States Patent
Tahmassebpur

(10) Patent No.: US 8,278,623 B2
(45) Date of Patent: Oct. 2, 2012

(54) HIGH-VACUUM VARIABLE APERTURE MECHANISM AND METHOD OF USING SAME

(75) Inventor: Mohammed Tahmassebpur, San Ramon, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/006,999

(22) Filed: Jan. 14, 2011

(65) Prior Publication Data

US 2012/0181444 A1 Jul. 19, 2012

(51) Int. Cl.
*G21K 5/04* (2006.01)
*H01J 37/09* (2006.01)

(52) U.S. Cl. ........................ 250/310; 250/306
(58) Field of Classification Search .......... 250/306, 250/307, 310, 311
See application file for complete search history.

(56) References Cited

U.S. PATENT DOCUMENTS

| | | | |
|---|---|---|---|
| 4,450,578 A * | 5/1984 | Hill ............................... | 378/152 |
| 4,952,814 A | 8/1990 | Huntzinger | |
| 5,495,110 A * | 2/1996 | Ohnishi et al. .................. | 850/63 |
| 5,886,357 A | 3/1999 | Kojima | |
| 6,194,734 B1 * | 2/2001 | Loomis et al. .......... | 250/492.21 |
| 6,462,807 B1 * | 10/2002 | Nishi .............................. | 355/53 |
| 6,977,386 B2 | 12/2005 | Gerlach et al. | |
| 2007/0257207 A1 * | 11/2007 | Frosien et al. ............ | 250/492.3 |
| 2008/0230694 A1 * | 9/2008 | Frosien ........................ | 250/307 |
| 2009/0074148 A1 * | 3/2009 | Echner ........................ | 378/152 |

* cited by examiner

*Primary Examiner* — Robert Kim
*Assistant Examiner* — David E Smith
(74) *Attorney, Agent, or Firm* — Okamoto & Benedicto LLP

(57) ABSTRACT

A novel technique is disclosed for varying a size of an aperture within a vacuum chamber. A drive mechanism within the vacuum chamber is used to adjust a partial horizontal overlap between at least two blades, wherein a perimeter of the aperture opening is defined by edges of said blades. In one embodiment, a variable aperture mechanism includes first and second blades attached to a first support, and third and fourth blades attached to a second support. The first blade is spaced vertically above the second blade on the first support; a second support, and the fourth blade is spaced vertically above the third blade on the second support. There is a partial horizontal overlap between the first and third blades and between the fourth and second blades, and the aperture opening has a perimeter defined by edges of the four blades. Other embodiments are also disclosed.

15 Claims, 11 Drawing Sheets

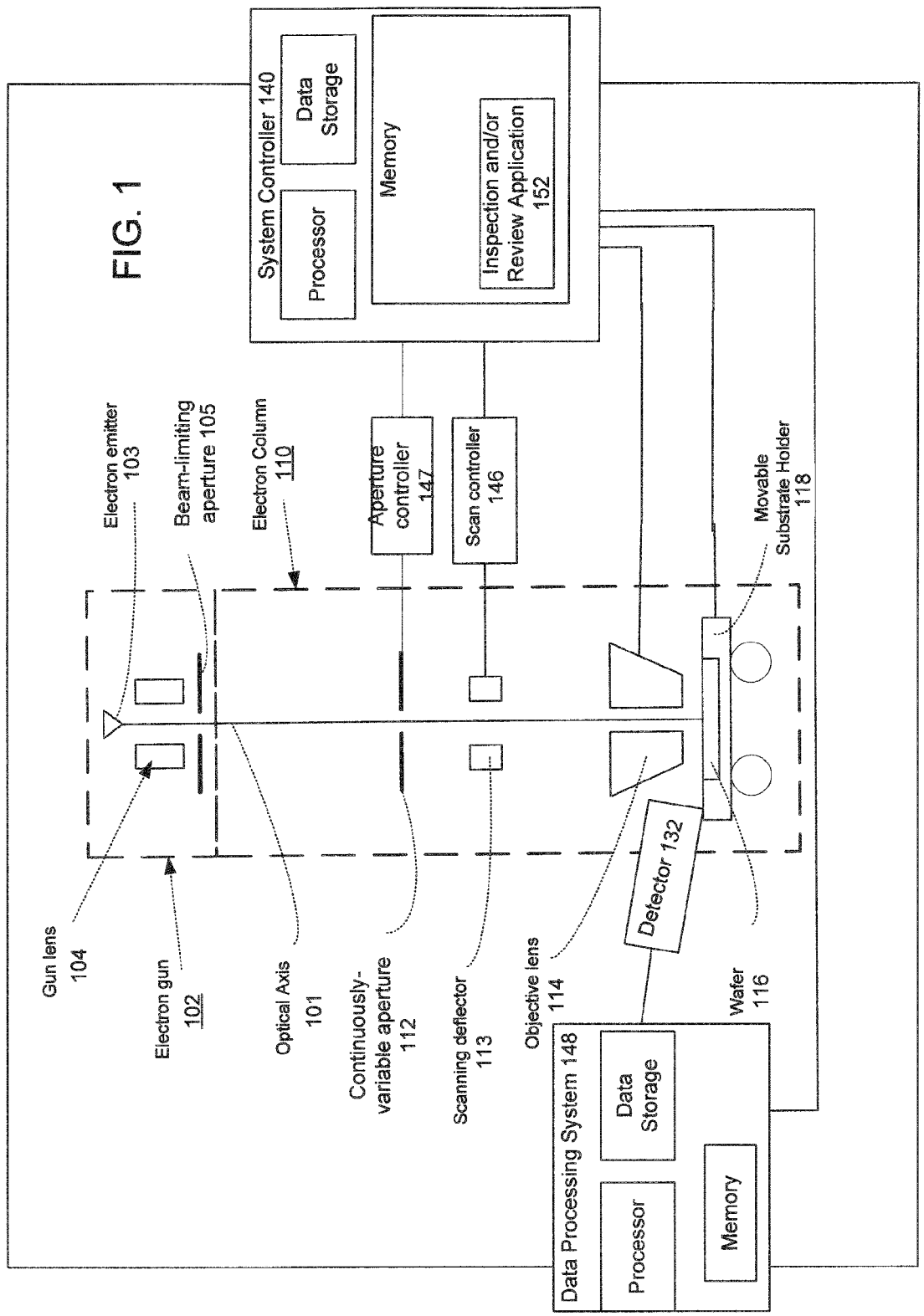

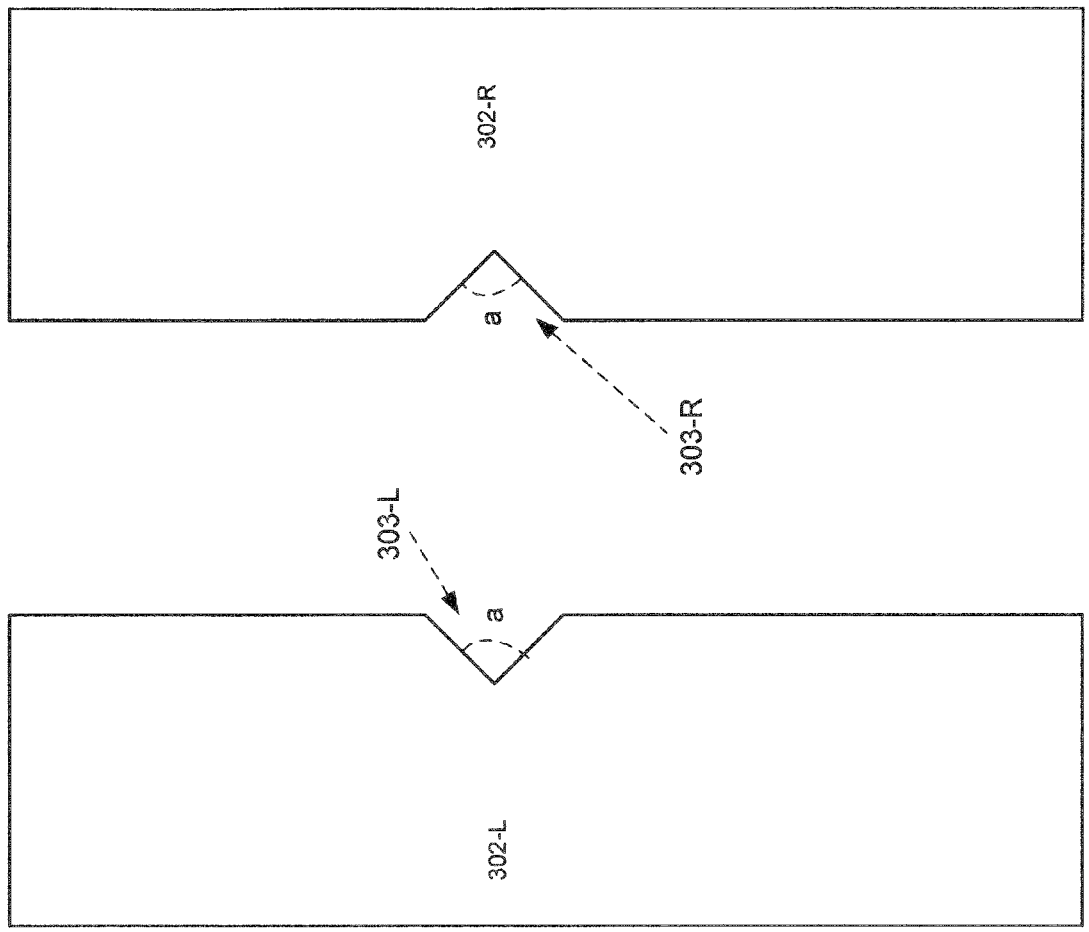

FIG. 3B
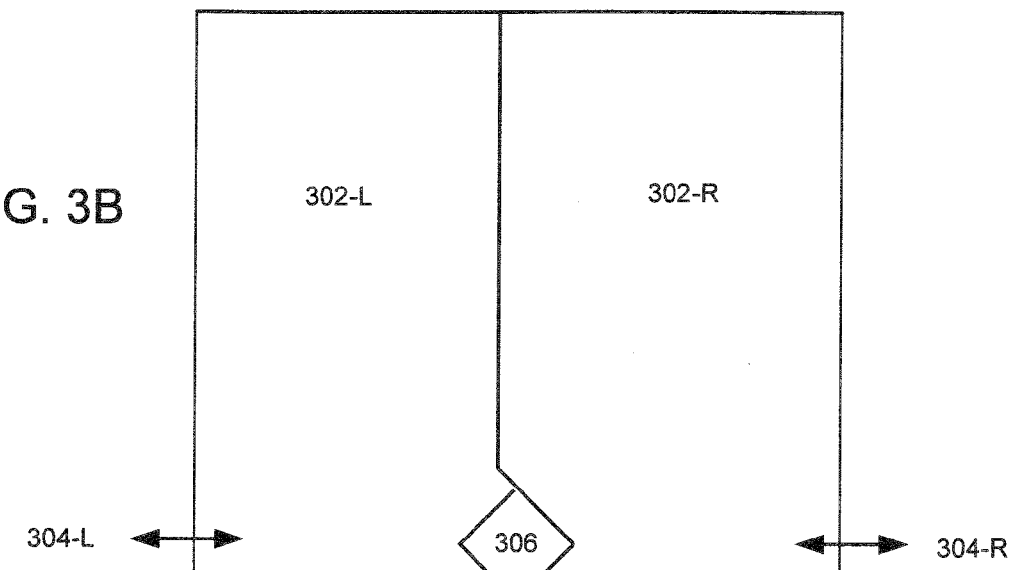
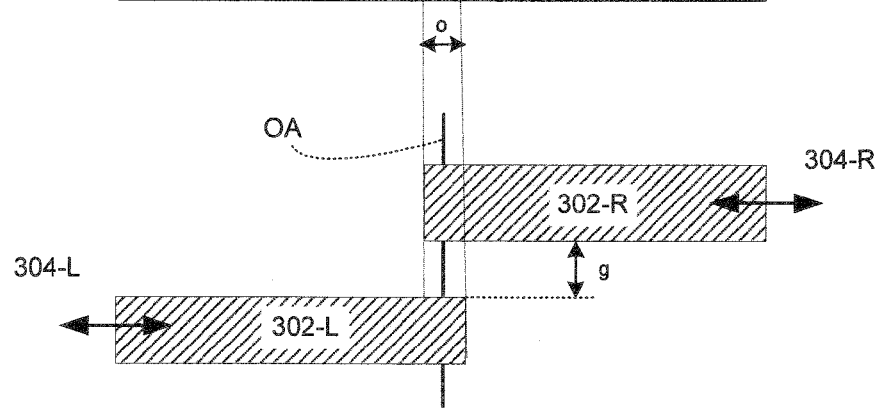
FIG. 3C

HIGH-VACUUM VARIABLE APERTURE MECHANISM AND METHOD OF USING SAME

BACKGROUND OF THE INVENTION

1. Field of the Invention

The present invention relates generally to electron beam apparatus and methods of using electron beam apparatus.

2. Description of the Background Art

Apertures to limit the beam current are needed in electron-beam columns to achieve desired beam spot sizes under various column conditions. For example, for a given column condition, a particular current limiting aperture size will be needed to achieve a certain spot size.

Historically, individual current-limiting apertures of various sizes and shapes have been installed on an aperture rod. A mechanism located on the atmospheric side of the electron column (i.e. outside of the high vacuum environment) is used to drive the desired fixed aperture to the optical axis of the column so that it limits the electron beam current.

SUMMARY

A technique is disclosed for varying a size of an aperture within a vacuum chamber. A drive mechanism within the vacuum chamber is used to adjust a partial horizontal overlap between at least two blades, wherein a perimeter of the aperture opening is defined by edges of said blades.

In one embodiment, a variable aperture mechanism includes first and second blades attached to a first support, and third and fourth blades attached to a second support. The first blade is spaced vertically above the second blade on the first support; a second support, and the fourth blade is spaced vertically above the third blade on the second support. There is a partial horizontal overlap between the first and third blades and between the fourth and second blades, and the aperture opening has a perimeter defined by edges of the four blades.

In another embodiment, the variable aperture mechanism includes a first blade having first and second edges, and a second blade having third and fourth edges. The second blade is spaced vertically from the first blade and has a partial horizontal overlap with the first blade. The aperture opening has a perimeter defined by the first, second, third and fourth edges.

Other embodiments, aspects and features are also disclosed.

BRIEF DESCRIPTION OF THE DRAWINGS

FIG. 1 is a cross-sectional diagram of an electron beam apparatus in accordance with an embodiment of the invention.

FIG. 3A shows a top view of two electron-opaque blades that are used in an electron-beam column variable aperture in accordance with another embodiment of the invention.

FIGS. 3B and 3C show a top view and a cross-sectional view, respectively, of the two blades of FIG. 3A as put together to form a variable aperture with one opening size in accordance with an embodiment of the invention.

Figure 2A:
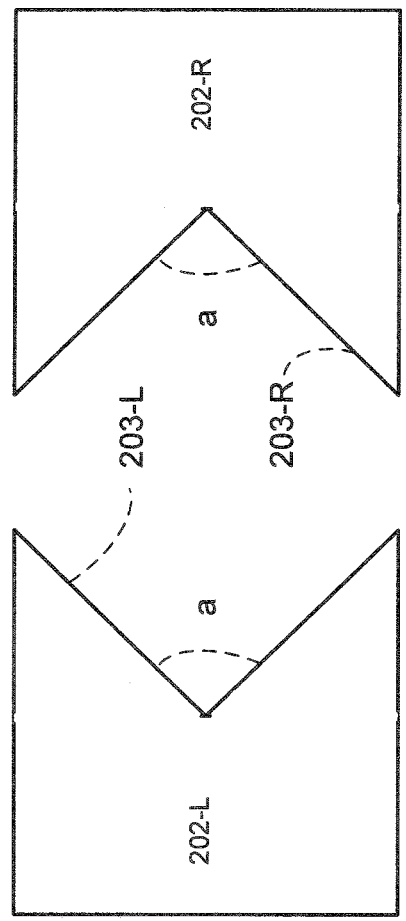
FIG. 2A shows a top view of two electron-opaque blades that are used in an electron-beam column variable aperture in accordance with an embodiment of the invention.

Note that the figures provided herewith are not necessarily to scale. They are provided for purposes of illustration to ease in the understanding of the presently-disclosed invention.

DETAILED DESCRIPTION

As discussed above, a conventional electron beam column uses an aperture rod with selectable current-limiting apertures of various sizes. However, if, for a given column condition, none of the selectable aperture sizes provides the desired spot size, then the column condition must generally be varied by calibration to achieve that spot size. The calibration process may be complex and be a limiting factor in column performance. Moreover, the calibration process may not always be able to accurately achieve the desired spot size.

One possible design for a continuously-variable aperture is an iris diaphragm (iris) design such as used in cameras. However, such a design is generally unsuitable for a high vacuum environment due to contact between moving blades of the diaphragm and aberrations caused by secondary electrons.

The present patent application discloses improved designs for apertures for a high-vacuum environment, such as an electron-beam column. The disclosed apertures are continuously-variable in size from a known maximum size down to a minimum size. This allows for the achievement of a desired beam spot size without need to change column conditions using a complex calibration process. In accordance with an embodiment of the invention, the continuously-variable aperture may be of the shape of a square, which applicant has determined is a shape suitable for imaging applications, such as electron beam inspection and review. Advantageously, the mechanism for the continuously-variable aperture may be implemented with substantially-reduced size such that it may fit within the electron-beam column.

FIG. 1 is a cross-sectional diagram of an electron beam (e-beam) apparatus in accordance with an embodiment of the invention. As shown, the e-beam apparatus includes an electron gun 102 and an electron-beam column (electron column) 110. As further shown, the e-beam apparatus may be configured to perform automated e-beam inspection and/or review of manufactured semiconductor substrates or reticles for lithography. Alternatively, the e-beam apparatus may be configured for other applications, such as, for example, e-beam lithography.

In the electron gun 102, the electron emitter 103 is a source of electrons, and the gun lens 104 focuses the emitted electrons to form an electron beam. The beam-limiting aperture 105 may be utilized to limit the size of the beam exiting the electron gun 102 and entering into the electron column 110 along the optical axis 101 of the column.

In the electron column 110, the continuously-variable current-selection aperture 112 may be used to select a desired beam spot size (and hence a desired beam current) with which to illuminate the target semiconductor wafer (or other target substrate) 116. A scanning deflector 113 may be configured to controllably scan (for example, raster scan) the beam across an area of the wafer 118, and a scan controller 146 may be coupled to the scanning deflector 113 and used to control said deflection.

The objective lens 114 is configured to focus the controllably deflected beam onto the wafer 116. A movable substrate holder 118 may be configured to hold the wafer 116 and transport (move) the wafer 116 under the electron column 110 for the purpose of automated inspection and/or review of defects, or automated measurement of critical dimensions, as blade of a semiconductor manufacturing process.

A detector 132 is arranged to detect secondary electrons (and/or backsignal electrons), and a data processing system 148 coupled to the detector 132 is used to store and process the detected data so as to be able to form useful images for analysis. The data processing system 148 may include a processor configured to execute instructions and operate on data, memory into which executable instructions and data may be loaded, non-transitory data storage, and various other components (such as a display, user input devices, and so on).

The apparatus further includes a system controller 140. The system controller 140 may include a processor configured to execute instructions and operate on data, memory into which executable instructions and data may be loaded, non-transitory data storage, and various other components (such as a display, user input devices, and so on). The system controller 140 may be communicatively coupled to the scan controller 146, the aperture controller 147, the data processing system 148, and various other components of the apparatus (such as voltage or current sources for various lenses, and so forth). The aperture controller 147 may be configured to control the size of the continuously-variable current-selection aperture 112.

For example, in accordance with an embodiment of the invention, the system controller 140 may include an inspection and/or review application 152. As shown in FIG. 1, the inspection and/or review application 152 may be loaded into the memory of the system controller 140 and may be executed by the processor of the system controller 140. The application 152 may be configured to control the electron beam apparatus during inspection and/or review of the substrate.

FIG. 2A shows a top view of two electron-opaque blades 202-L and 202-R that are used in an electron-beam column variable aperture in accordance with an embodiment of the invention. As shown, each blade (202-L and 202-R) may include a "V" or triangular-shaped cutout or open area (203-L and 203-R, respectively) with a vertex angle ("a"). In accordance with one embodiment of the invention, the vertex angle of the cutout may be ninety degrees so as to form a right angle.

Each blade (202-L and 202-R) may be effectively opaque to electrons in that impinging electrons are not transmitted through the bulk of the material of the blade. These electron-opaque aperture blades may be formed using, for example, molybdenum, platinum, a platinum-rhenium alloy, or silicon.

Figure 2D:
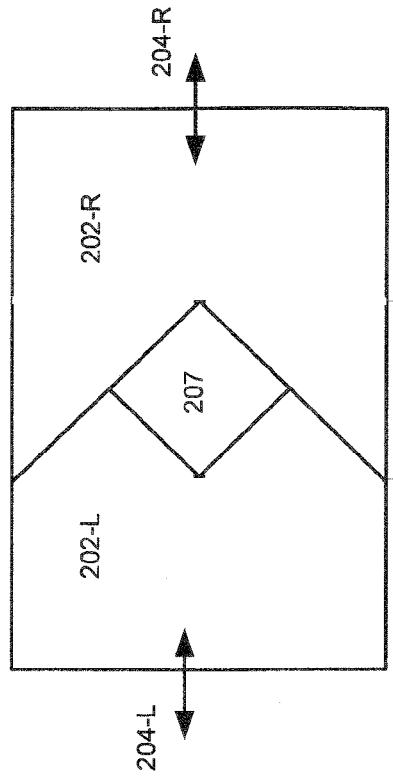
FIGS. 2D and 2E show a top view and a cross-sectional view, respectively, of the two blades of FIG. 2A as put together to form a variable aperture with another opening size in accordance with an embodiment of the invention.
Figure 2E:
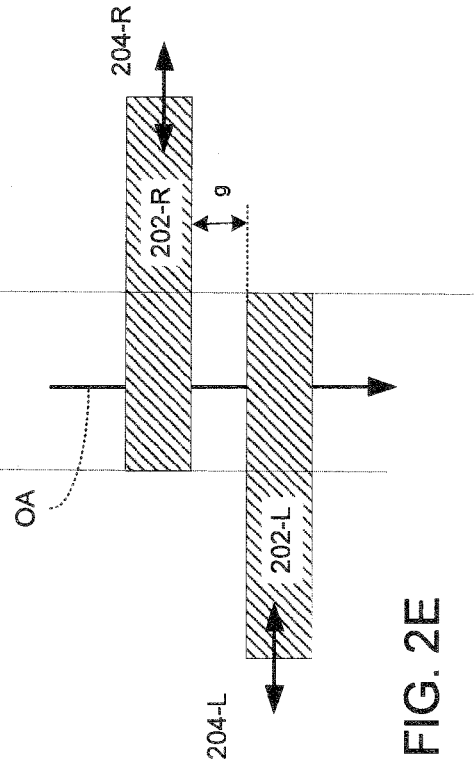
Figure 2B:
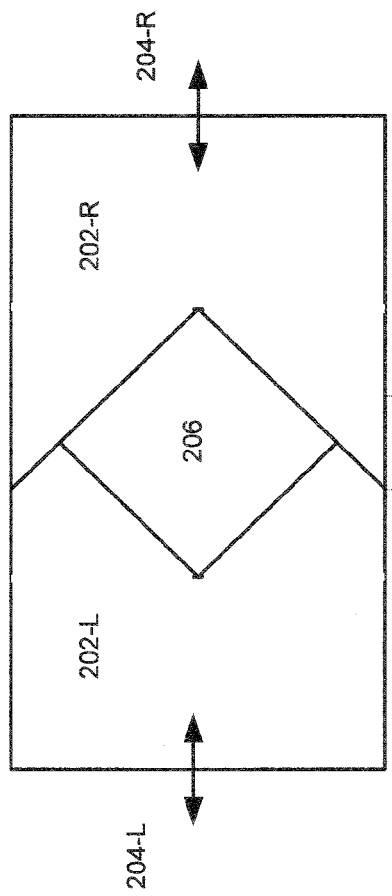
FIGS. 2B and 2C show a top view and a cross-sectional view, respectively, of the two blades of FIG. 2A as put together to form a variable aperture with one opening size in accordance with an embodiment of the invention.
Figure 2C:
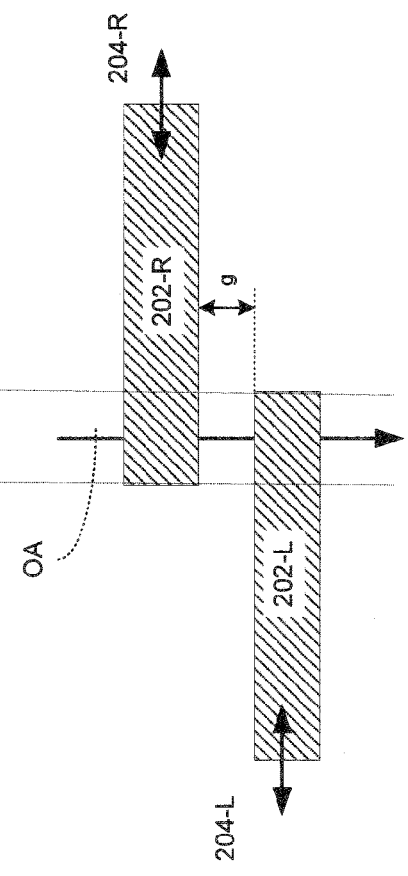

FIGS. 2B and 2C show a top view and a cross-sectional view, respectively, of the two blades (202-L and 202-R) of FIG. 2A as put together to form a variable aperture with one opening size 206 in accordance with an embodiment of the invention. As shown in FIG. 2B, each blade (202-L and 202-R) may be moved towards or away from the other as indicated by the arrows (204-L and 204-R, respectively) so as to vary the size of the aperture. As shown in FIG. 2C, one blade (in this example, 202-R) is positioned above the other blade (in this example, 202-L) with a horizontal overlap ("o") and a vertical gap ("g") therebetween. The optical axis (OA) of the electron-beam column may be positioned at the middle of the horizontal overlap so as to pass through the center of the opening 206.

FIGS. 2D and 2E show a top view and a cross-sectional view, respectively, of the two blades of FIG. 2A as put together to form a variable aperture with another opening size 207 in accordance with an embodiment of the invention. As shown in FIG. 2E, the horizontal overlap ("o") between the two blades is larger (than in FIG. 2C) such that the opening size 207 is larger in FIG. 2D than the opening size 206 in FIG. 2B.

Advantageously, the vertical gap prevents contact (rubbing) between the moving blades of the variable aperture. Furthermore, in accordance with an embodiment of the invention, no aperture rod and bellows are needed to move the aperture blades (per the arrows 204-L and 204-R). Instead, the mechanism for moving the blades may be implemented entirely within the electron-beam column using, for example, the structure described below in relation to FIG. 5.

FIG. 3A shows a top view of two electron-opaque blades (302-L and 302-R) that are used in an electron-beam column variable aperture in accordance with another embodiment of the invention. As shown, each blade (302-L and 302-R) may include a "V" or triangular-shaped cutout or open area (303-L and 303-R, respectively) with a vertex angle ("a"). In accordance with one embodiment of the invention, the vertex angle of the cutout may be ninety degrees so as to form a right angle.

Each blade (302-L and 302-R) may be effectively opaque to electrons in that impinging electrons are not transmitted through the bulk of the material of the blade. These electron-opaque aperture blades may be formed using, for example, molybdenum, platinum, a platinum-rhenium alloy, or silicon.

FIGS. 3B and 3C show a top view and a cross-sectional view, respectively, of the two blades of FIG. 3A as put together to form a variable aperture with one opening size 306 in accordance with an embodiment of the invention. As shown in FIG. 3B each blade (302-L and 302-R) may be moved towards or away from the other as indicated by the arrows (304-L and 304-R, respectively) so as to vary the size of the aperture. As shown in FIG. 3C, one blade (in this example, 302-R) is positioned above the other blade (in this example, 302-L) with a horizontal overlap ("o") and a vertical gap ("g") therebetween. The optical axis (OA) of the electron-beam column may be positioned at the middle of the horizontal overlap so as to pass through the center of the opening 306.

Figure 3D:
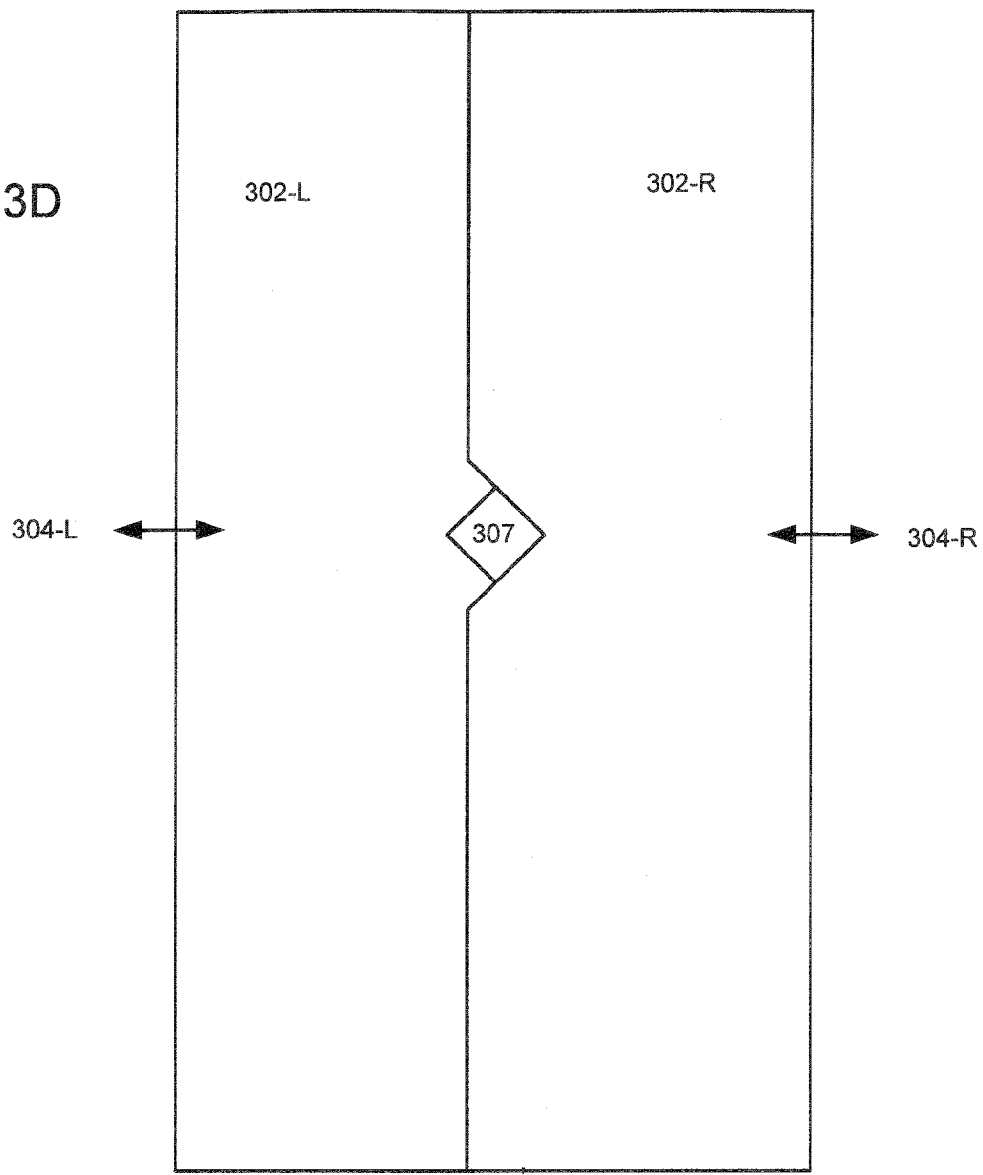
FIGS. 3D and 3E show a top view and a cross-sectional view, respectively, of the two blades of FIG. 3A as put together to form a variable aperture with another opening size in accordance with an embodiment of the invention.
Figure 3E:
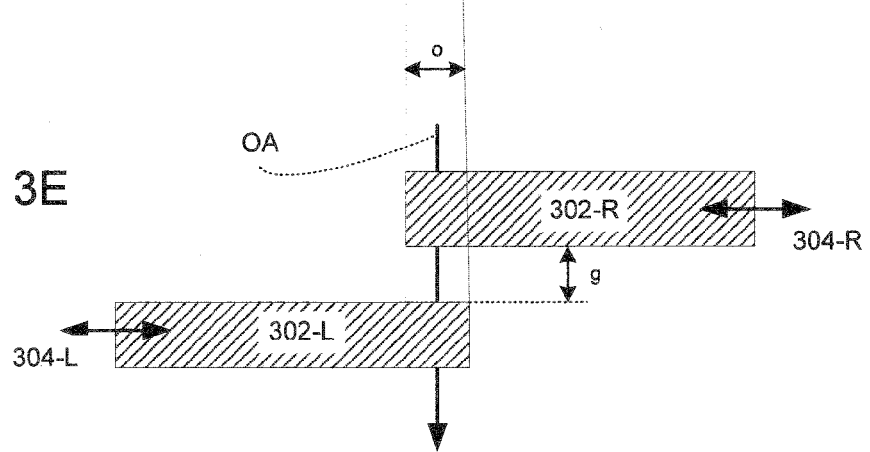

FIGS. 3D and 3E show a top view and a cross-sectional view, respectively, of the two blades of FIG. 3A as put together to form a variable aperture with another opening size 307 in accordance with an embodiment of the invention. As shown in FIG. 3E, the horizontal overlap ("o") between the two blades is larger (than in FIG. 3C) such that the opening size 307 is larger in FIG. 3D than the opening size 306 in FIG. 3B.

The vertical gap advantageously prevents contact (rubbing) between the moving blades of the variable aperture. Furthermore, in accordance with an embodiment of the invention, no aperture rod and bellows are needed to move the aperture blades (per the arrows 304-L and 304-R). Instead, the mechanism for moving the blades may be implemented entirely within the electron-beam column using, for example, the structure described below in relation to FIG. 5.

Figure 4A:
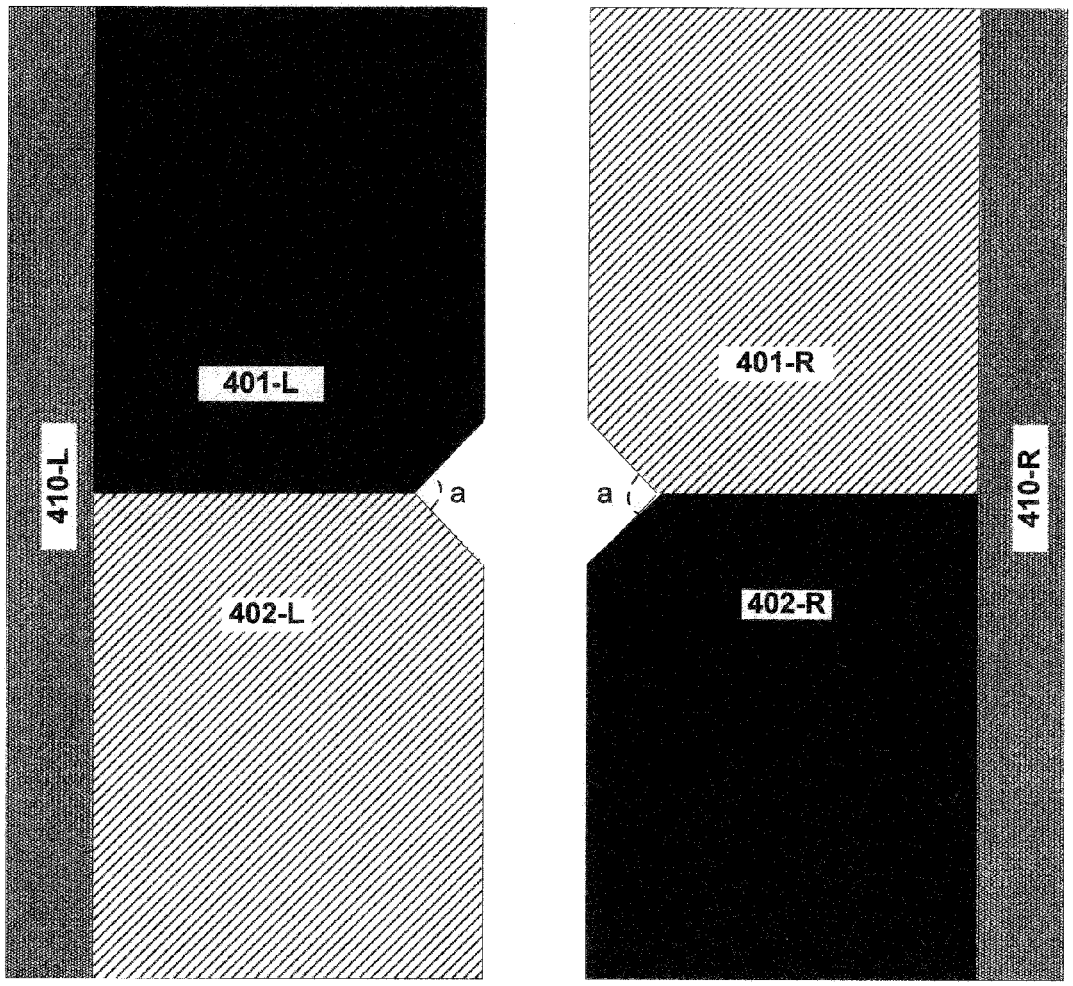
FIG. 4A shows a top view of four electron-opaque blades that are used in an electron-beam column variable aperture in accordance with another embodiment of the invention.

FIG. 4A shows a top view of four electron-opaque blades (401-L, 401-R, 402-L and 402-R) that are used in an electron-beam column variable aperture in accordance with another embodiment of the invention. As shown, a first pair of blades (the left pair, 401-L and 402-L) may be attached to a first support member 410-L to form a first (left) assemblage, and a second pair of blades (the right pair, 401-R and 402-R) may be attached to a second support member 410-R to form a second (right) assemblage.

As shown in FIG. 4A, each blade (401-L, 401-R, 402-L and 402-R) may include a cut corner (i.e. an open area at a corner), and the opening of the aperture may be formed from the cut corners as described below. The two cut corners for each pair of blades appear, from the top view, to form include a "V" or triangular-shaped cutout with a vertex angle ("a"), which may be ninety degrees so as to form a right angle in accordance with one embodiment of the invention.

Each blade (401-L, 401-R, 402-L and 402-R) may be effectively opaque to electrons in that impinging electrons are not transmitted through the bulk of the material of the blade. These electron-opaque aperture blades may be formed using, for example, molybdenum, platinum, a platinum-rhenium alloy, or silicon.

Note that, in FIGS. 4B-4H, the support blades 410-L and 410-R are not shown for ease of illustration.

Figure 4B:
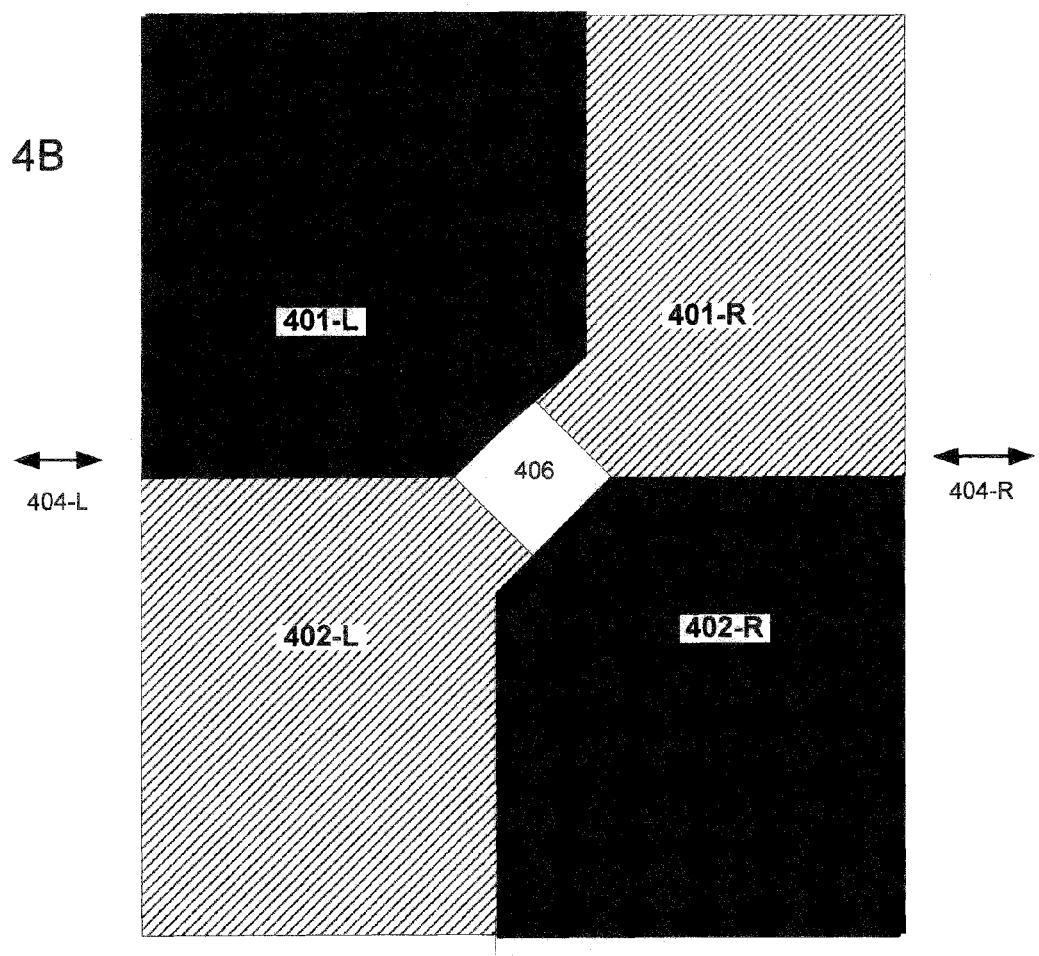
FIGS. 4B, 4C and 4D show a top view and first and second cross-sectional views, respectively, of the four blades of FIG. 4A as put together to form a variable aperture with one opening size in accordance with an embodiment of the invention.
Figure 4C:
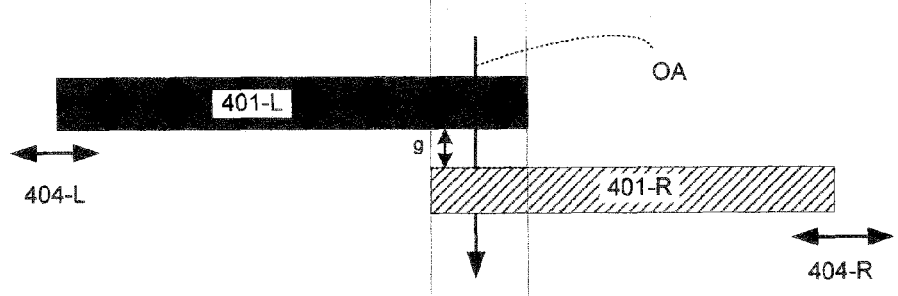
Figure 4D:
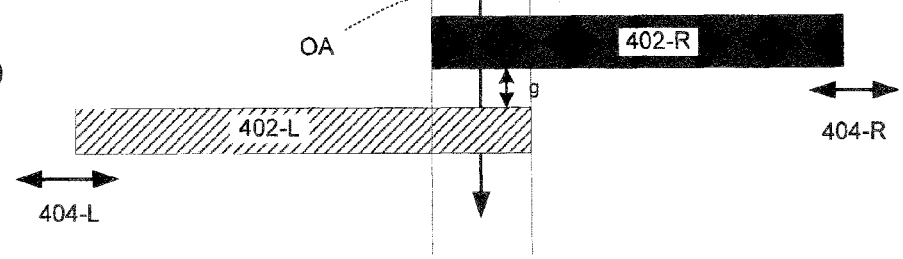

FIGS. 4B, 4C and 4D show a top view and first and second cross-sectional views, respectively, of the four blades of FIG. 4A as put together to form a variable aperture with a first opening size 406 in accordance with an embodiment of the invention. As shown in FIG. 4B, the left and right assemblages may be moved towards or away from the other as indicated by the arrows (404-L and 404-R, respectively) so as to vary the size of the aperture.

As shown in FIG. 4C, a first blade of the left assemblage (in this example, 401-L) is positioned above a corresponding first blade of the right assemblage (in this example, 401-R) with a horizontal overlap ("o") and a vertical gap ("g") therebetween. As shown in FIG. 4D, a second blade of the left assemblage (in this example, 402-L) is positioned below a corresponding second blade of the right assemblage (in this example, 402-R) with a horizontal overlap ("o") and a vertical gap ("g") therebetween. The optical axis (OA) of the electron-beam column may be positioned at the middle of the horizontal overlaps so as to pass through the center of the opening 406.

Figure 4E:
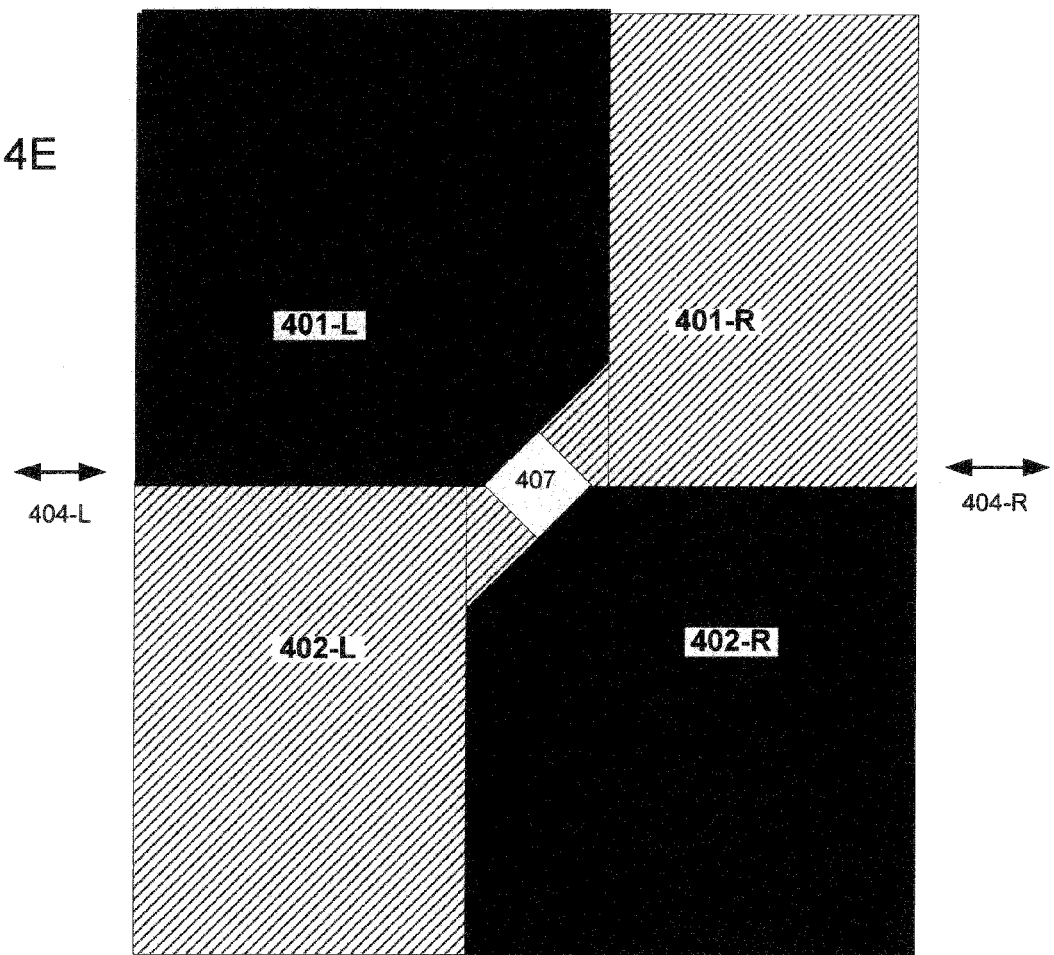
FIGS. 4E, 4F and 4G show a top view and first and second cross-sectional views, respectively, of the four blades of FIG. 4A as put together to form a variable aperture with another opening size in accordance with an embodiment of the invention.
Figure 4F:
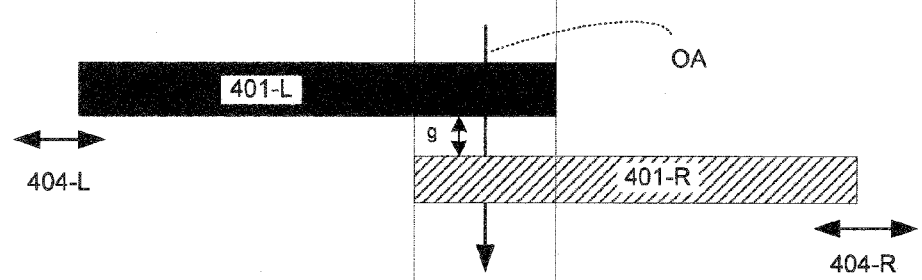
Figure 4G:
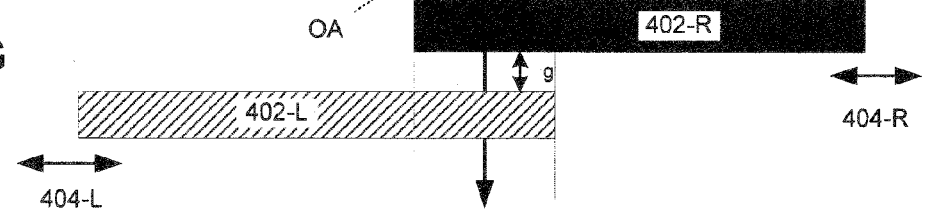

FIGS. 4E, 4F and 4G show a top view and first and second cross-sectional views, respectively, of the four blades of FIG. 4A as put together to form a variable aperture with a second opening size 407 in accordance with an embodiment of the invention. As shown in FIGS. 4F and 4G, the horizontal overlap ("o") between the two blades is larger (than in FIGS. 4C and 4D) such that the opening size 407 is larger in FIG. 4E than the opening size 406 in FIG. 4B.

One aspect of this four-blade embodiment of the invention is that it has diagonal symmetry with respect to the beam (i.e. the optical axis of the column). This advantageously reduces aberrations because the four-blade aperture as described above creates a diagonally symmetrical field which effectively acts as a symmetrical electrostatic lens. In comparison, the two-blade embodiments described above in relation to FIGS. 2A-2E and FIGS. 3A-3E creates an asymmetrical field around the beam.

Figure 4H:
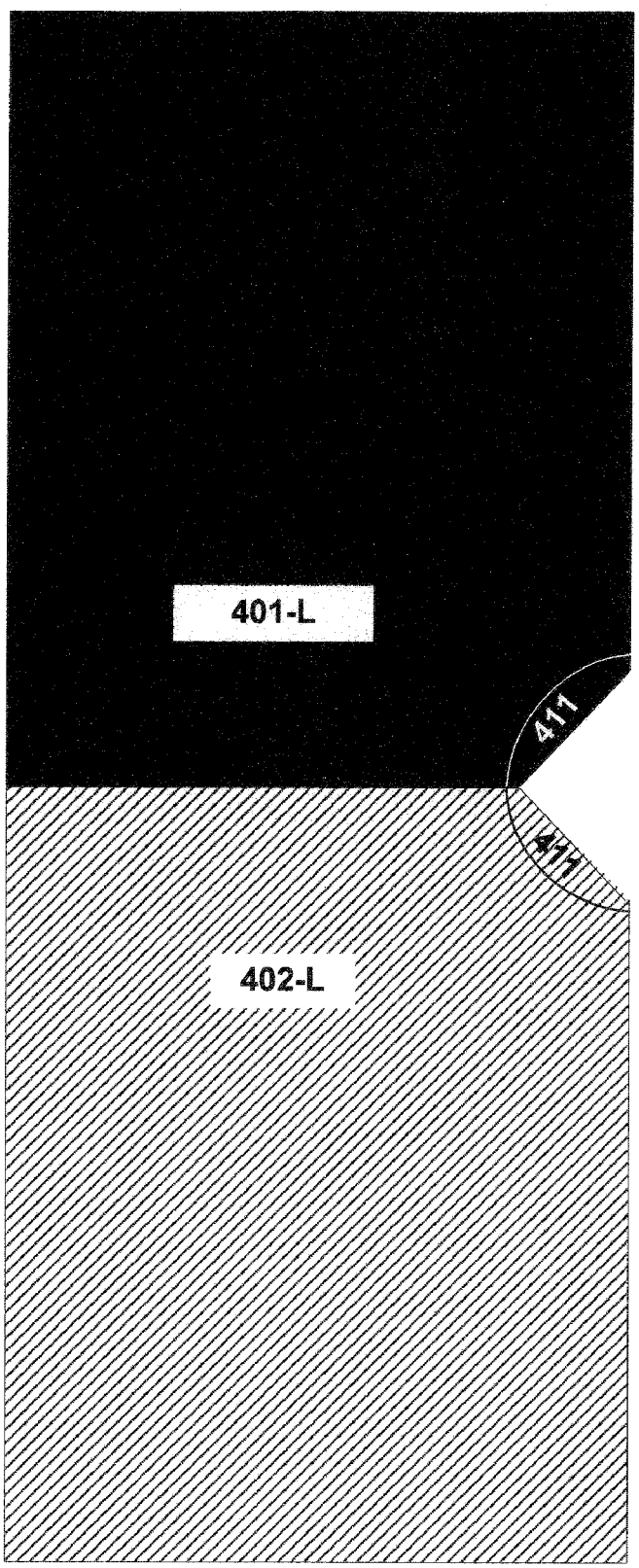
FIG. 4H is a top view of an aperture blade showing thinner regions at the aperture edges in accordance with an embodiment of the invention.

FIG. 4H is a top view of an aperture blade showing thinner regions 411 near the aperture edges in accordance with an embodiment of the invention. Such a thinner region 411 may be formed near the aperture edge of each of the four blades (401-L, 401-R, 402-L and 402-R) in FIGS. 4A-4G. Similarly, in accordance with embodiments of the present invention, thinner regions may be formed at the aperture edges for the "V" shaped cutouts 203-L and 203-R in FIGS. 2A-2E and 303-L and 303-R in FIGS. 3A-3E. The thinner regions may advantageously reduce aberrations due to secondary electrons.

In one example implementation, the thickness of the bulk of the blade may be 500 microns, while the thickness of the thinner regions 411 may be 25 microns. Other thicknesses may be used in different implementations. The edges of the thinner regions 411 defining the perimeter of the aperture may be further thinned by chamfering or beveling (for example, to create a bevel at an angle of 45 degrees).

Figure 5:
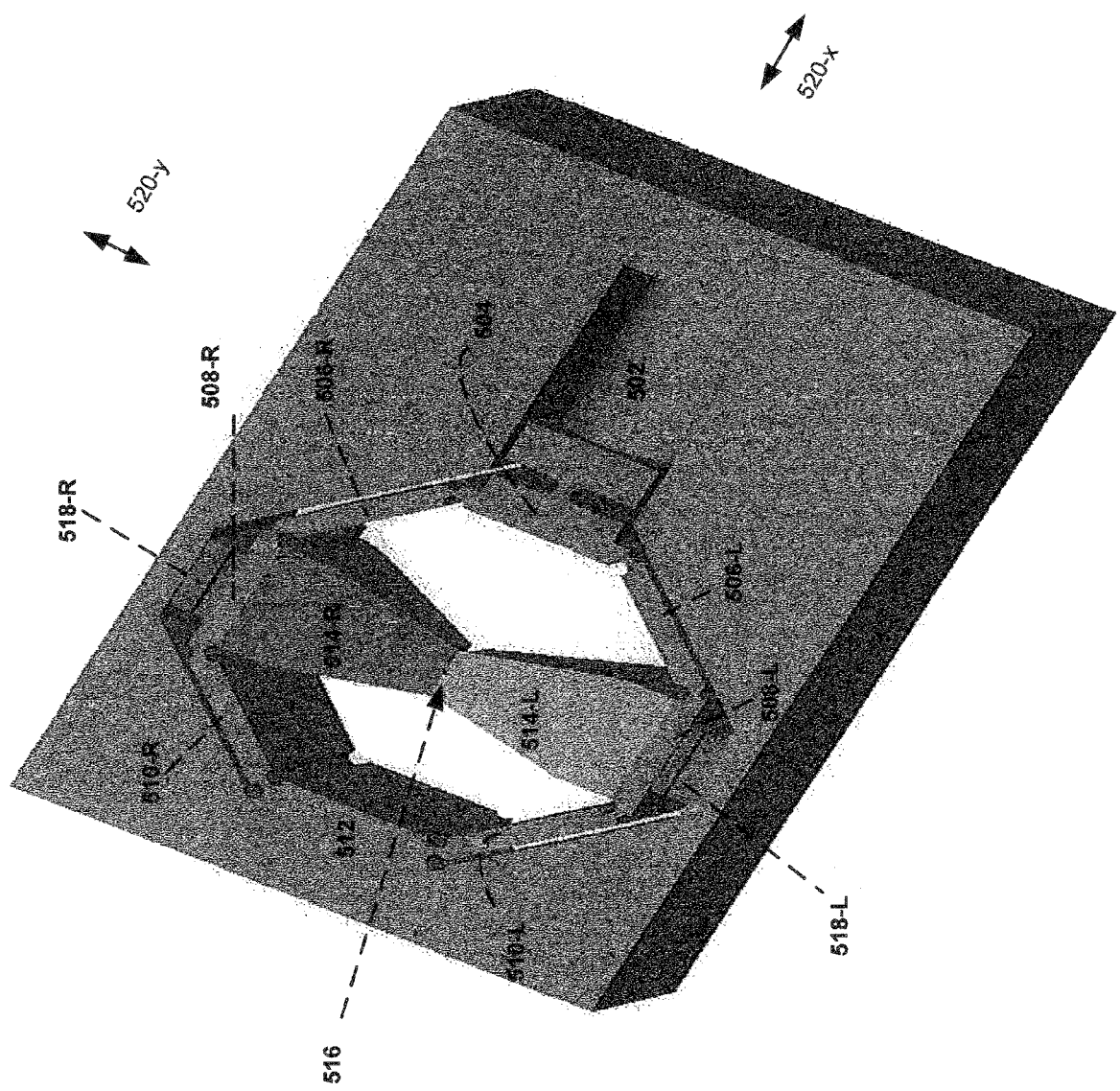
FIG. 5 is a perspective view of an in-vacuum flexure mechanism for varying the size of an electron-beam column variable aperture in accordance with an embodiment of the invention.

FIG. 5 is a perspective view of an in-vacuum flexure mechanism for varying the size of an electron-beam column variable aperture in accordance with an embodiment of the invention. The flexure mechanism is designed such that there is very little mechanical "cross-talk" from the x or y axis to the z-axis, where the z-axis is along the optical axis of the column. In other words, while the flexure mechanism moves the blades in the x and/or y directions in the plane perpendicular to the z-axis, motion along the z-axis is minimized.

The amount of motion in the z-direction is sufficiently low so as to avoid the possibility of the closely-spaced aperture blades from rubbing against each other. Such rubbing generates unwanted particles in a vacuum environment. Particles generated within the vacuum of an electron beam column impact the electron beam adversely and also may contaminate the target substrate (for example, a semiconductor wafer being inspected).

As shown, the mechanism may include a drive mechanism 502 (such as, for example, a piezoelectric transducer), a first mechanical coupling 504, first left and right diagonal couplings (506-L and 506-R, respectively), left and right side couplings (508-L and 508-R), second left and right diagonal couplings (510-L and 510-R, respectively), a base blade 512, and left and right support arms (514-L and 514-R).

The continuously-variable aperture 516 is formed at the end of the support arms (514-L and 514-R) in the middle of where they meet. The continuously-variable aperture 516 may be formed using two electron-opaque blades (such as, for example, shown in FIGS. 2A-2E or FIGS. 3A-3E) or using four electron-opaque blades (such as, for example, shown in FIGS. 4A-4G). The aperture edges may be thinned (as shown in FIG. 4H).

The drive mechanism 502 is used to vary the size of the aperture 516. For example, if the drive mechanism 502 is a piezoelectric transducer, then the voltage applied to the piezoelectric transducer may be varied to change the size of the aperture. If the drive mechanism 502 is lengthened, then the aperture size is increased. On the other hand, if the drive mechanism 502 is shortened, then the aperture size is reduced.

In accordance with one embodiment, the mechanism further includes symmetrically-mounted capacitative gauges (518-L and 518-R) which are configured to serve as a closed-loop feedback mechanism. In one implementation, this feedback mechanism enables control of the aperture size to a precision of 5 to 10 nanometers. This enables the size of the aperture to be varied, for example, in increments of 100 nanometers, 50 nanometer, or even 20 nanometers. Alternatively, a strain gauge may be attached to the piezoelectric transducer or other drive mechanism to provide a measure of its length for purposes of feedback control.

For macro-positioning and initial calibration of the aperture center, a separate x-y macro-positioning control (520-*x* and 520-*y*) may be incorporated within the air-side (i.e. the non-vacuum side) of the mechanism module. After the mechanism module is installed in the column, the x-y macro-positioning control may be used to align the center of the aperture opening with the primary electron beam (i.e. with the optical axis) of the column. Alternatively, an r-θ macro-positioning control may be used to align the aperture. The desired macro-position may then be locked into place. Subsequently, using the closed-loop mechanism discussed above, the size of the aperture may be varied to achieve the desired spot size (i.e. the desired beam current).

In accordance with one embodiment, the macro-positioning alignment may be automated (using a detector and an automated procedure) such that, for a given column condition, the aperture is positioned such that it captures a central portion of the beam (i.e. allows the "sweet spot" of the beam to pass through). In other words, the default position of the center of the variable-sized aperture in the x-y plane may be varied using an automated procedure. This is in addition to varying the size of the aperture, which may also be automated (using a detector and an automated procedure).

Applicant has performed electron-beam column simulations to show that, for imaging applications, the square apertures disclosed herein perform nearly the same in electron optics as conventional round apertures. Hence, a conventional round aperture generally may be replaced by a square aperture of the same area for electron imaging.

Applicant has further performed experiments with aperture blades of approximately 20 having vertical gaps between aperture blades ranging from 10 microns to 30 microns. These experiments have indicated acceptably low amounts of scattered electrons.

Advantageously, the presently-disclosed aperture mechanism is compatible with a high-vacuum environment. In part, this is because the opening size may be varied without contact (rubbing) between the parts that define the opening. As described above, one aspect of the flexure mechanism is minimal movement of the blades in the vertical direction so as to avoid such undesirable contact. In one implementation, the aperture mechanism may operate in a vacuum chamber having a pressure of no more than $10^{-9}$ Torr. In other words, during operation of an electron beam apparatus, the aperture mechanism disclosed herein avoids rubbing between parts so as not to generate particles. In addition, the material of the aperture outgasses at less than $10^{-9}$ Torr.

Moreover, because the presently-disclosed aperture mechanism is designed to achieve high accuracy without undue complexity, fabrication and installation of the aperture mechanism may be readily achieved. Different styles, shapes and configurations of the aperture blades and of the flexure mechanism are contemplated to be within the scope of the presently-disclosed invention.

The high-vacuum continuously-variable size aperture disclosed herein may be used with various charged-particle beams, such as electron beams, ion beams, and also with laser beams and other light (photon) beams. Thus, the use of the aperture disclosed herein is not necessarily limited to electron-beam columns.

Furthermore, the high-vacuum aperture disclosed herein is well suited for use in extreme ultra-violet (EUV) lithography and inspection apparatus. This is because such EUV apparatus typically requires an ultra high vacuum (UHV) environment. Hence, it is contemplated that the variable aperture disclosed herein is also particularly suitable for use in EUV instruments and other apparatus with UHV chambers.

In comparison to the aperture mechanism disclosed herein, a conventional aperture mechanism uses a finite set of fixed size apertures. To switch from one aperture size to another, a mechanism located on the atmospheric (non-vacuum) side is moved in x-y or r-θ directions. Such movement generally requires motion of complex and high-load stages and bellows on the atmospheric side of the electron-column. There is typically no mechanism to provide feedback control as to the accuracy of the positioning of the selected aperture in relation to the electron beam. In fact, there may very well be deviation from the ideal (centered) position, such deviation being undesirable for a high-precision electron-optics column.

In addition, the conventional aperture rod extends from the atmospheric side of the column into the vacuum within the column. This creates, in effect, a "cold finger" which collects particles and contamination on the installed apertures. To remove the contamination, the aperture rod and the apertures mounted on it must be heated using a heater that is typically built into the aperture rod. Such a heater causes further contamination within the electron column when the rod is heated. Moreover, the need for such a heater introduces further complexity into the conventional aperture mechanism, making the overall mechanism larger. The large size of the conventional aperture mechanism prevents the electron-beam column from being shrunk in either height or diameter. This makes it difficult to design shorter high-resolution columns or small-diameter multi-columns.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for imaging a surface of a manufactured substrate, the apparatus comprising:
   a source for generating a beam;
   a vacuum chamber;
   a variable aperture mechanism within the vacuum chamber which is configured to select a spot size for the beam, wherein the variable aperture mechanism has diagonal symmetry in relation to the beam;

a lens system configured to focus the beam onto a surface of the substrate;

a detector configured to detect radiation emitted from the substrate as a result of the beam impinging onto the surface;

a stage configured to hold the substrate and controllably move the substrate under the beam; and a system controller configured to execute an imaging application, wherein the variable aperture mechanism comprises:

a first support;

a first blade attached to the first support and having a first edge;

a second blade attached to the first support and having a second edge, wherein the first blade is spaced vertically above the second blade on the first support;

a second support;

a third blade attached to the second support and having a third edge; and a fourth blade attached to the second support and having a fourth edge, wherein the fourth blade is spaced vertically above the third blade on the second support, wherein there is a partial horizontal overlap between the first and third blades and between the fourth and second blades, and wherein an opening of the variable aperture mechanism has a perimeter defined by the first, second, third and fourth edges from a top-down view.

2. The apparatus of claim 1, wherein the variable aperture mechanism further comprises:

a first vertex angle between the first and second edges from the top-down view; and a second vertex angle between the third and fourth edges from the top-down view.

3. The apparatus of claim 2, wherein each said blade includes a thinner region at said edges.

4. The apparatus of claim 1, wherein the variable aperture mechanism is configured to vary a size of the opening by adjusting the partial horizontal overlap.

5. The apparatus of claim 1, wherein the variable aperture mechanism further comprises a drive mechanism which is mechanically coupled to the first and second supports, wherein the drive mechanism is housed within a vacuum chamber of the apparatus.

6. The apparatus of claim 1, further comprising:

a macro-positioning mechanism to align a center of an opening of the variable aperture mechanism with the beam.

7. The apparatus of claim 6, wherein the variable aperture mechanism is configured to adjust a size of the opening in increments of 100 nanometers or less.

8. The apparatus of claim 7, further comprising:

a closed-loop feedback mechanism to control the size of the opening.

9. The apparatus of claim 1, wherein the variable aperture mechanism has an outgas rate during operation which is compatible with a vacuum of $10^{-9}$ Torr.

10. A variable aperture mechanism comprising:

a first support;

a first blade attached to the first support and having a first edge;

a second blade attached to the first support and having a second edge, wherein the first blade is spaced vertically above the second blade on the first support;

a second support;

a third blade attached to the second support and having a third edge; and a fourth blade attached to the second support and having a fourth edge, wherein the fourth blade is spaced vertically above the third blade on the second support, wherein there is a partial horizontal overlap between the first and third blades and between the fourth and second blades, and wherein an opening of the variable aperture mechanism has a perimeter defined by the first, second, third and fourth edges from a top-down view.

11. The variable aperture mechanism of claim 10, further comprising:

a first vertex angle between the first and second edges from the top-down view; and a second vertex angle between the third and fourth edges from the top-down view.

12. The variable aperture mechanism of claim 11, wherein the first and second vertex angles are each right angles.

13. The variable aperture mechanism of claim 10, wherein the variable aperture mechanism is configured to vary a size of the opening by adjusting the partial horizontal overlap.

14. The variable aperture mechanism of claim 10, wherein the variable aperture mechanism further comprises a drive mechanism which is mechanically coupled in a symmetrical manner to the first and second supports.

15. The variable aperture mechanism of claim 14, further comprising:

a closed-loop feedback mechanism to control the size of the opening.

* * * * *